(12) United States Patent
Le Toquin

(10) Patent No.: US 8,415,692 B2
(45) Date of Patent: Apr. 9, 2013

(54) LED PACKAGES WITH SCATTERING PARTICLE REGIONS

(75) Inventor: Ronan Le Toquin, Ventura, CA (US)

(73) Assignee: Cree, Inc., Durham, NC (US)

( * ) Notice: Subject to any disclaimer, the term of this patent is extended or adjusted under 35 U.S.C. 154(b) by 541 days.

(21) Appl. No.: 12/498,253

(22) Filed: Jul. 6, 2009

(65) Prior Publication Data

US 2011/0001151 A1    Jan. 6, 2011

(51) Int. Cl.
*H01L 33/44* (2010.01)
*H01L 33/48* (2010.01)
*H01L 33/50* (2010.01)
*H01L 33/58* (2010.01)

(52) U.S. Cl.
USPC ............... 257/98; 257/E33.067; 257/E33.074

(58) Field of Classification Search ............ 257/98, 257/E33.067, E33.074
See application file for complete search history.

(56) References Cited

U.S. PATENT DOCUMENTS

| | | | |
|---|---|---|---|
| 3,760,237 A | 9/1973 | Jaffe ............................. 257/98 |
| 4,152,044 A | 5/1979 | Liu | |
| 4,307,297 A | 12/1981 | Groff | |
| 4,511,425 A | 4/1985 | Boyd et al. .................... 156/493 |
| 4,675,575 A | 6/1987 | Smith et al. | |
| 4,914,489 A | 4/1990 | Awano ............................. 257/6 |
| 4,946,547 A | 8/1990 | Palmour et al. ............... 156/643 |
| 4,963,948 A | 10/1990 | Awano .......................... 257/183 |
| 5,034,783 A | 7/1991 | Chang et al. .................. 257/192 |
| 5,040,868 A | 8/1991 | Waitl | |
| 5,130,761 A | 7/1992 | Tanaka ............................ 357/17 |
| 5,167,556 A | 12/1992 | Stein | |
| 5,200,022 A | 4/1993 | Kong et al. .................... 156/612 |
| 5,351,106 A | 9/1994 | Lesko et al. ..................... 355/83 |
| RE34,861 E | 2/1995 | Davis et al. .................... 437/100 |
| 5,477,436 A | 12/1995 | Bertling et al. | |
| 5,703,401 A | 12/1997 | Van De Water et al. | |
| 5,706,177 A | 1/1998 | Nather | |
| 5,790,298 A | 8/1998 | Tonar ............................ 359/267 |
| 5,813,753 A | 9/1998 | Vriens et al. .................. 362/293 |

(Continued)

FOREIGN PATENT DOCUMENTS

| BE | 20090254 | 7/2011 |
|---|---|---|
| CN | 2498694 | 7/2002 |

(Continued)

OTHER PUBLICATIONS

Official Notice of Decision for Refusal regarding related Japanese Design Application No. 2009-002857, dated Nov. 17, 2009.

(Continued)

*Primary Examiner* — Evan Pert
(74) *Attorney, Agent, or Firm* — Koppel, Patrick, Heybl & Philpott

(57) ABSTRACT

An LED package comprises at least one LED that emits LED light in an LED emission profile. The LED package includes regions of scattering particles with the different regions scattering light primarily at a target wavelength or primarily within a target wavelength range. The location of the regions and scattering properties are based at least partially on the LED emission profile. The regions scatter their target wavelength of LED light to improve the uniformity of the LED emission profile so that the LED package emits a more uniform profile compared to the LED emission profile. By targeting particular wavelengths for scattering, the emission efficiency losses are reduced.

34 Claims, 4 Drawing Sheets

U.S. PATENT DOCUMENTS

| | | | |
|---|---|---|---|
| 5,907,151 A | 5/1999 | Gramann | |
| 5,959,316 A | 9/1999 | Lowery | 257/98 |
| 6,046,464 A | 4/2000 | Schetzina | 257/96 |
| 6,061,160 A | 5/2000 | Maruyama | 359/152 |
| 6,066,861 A | 5/2000 | Hohn et al. | |
| 6,150,672 A | 11/2000 | Kaneko | 257/94 |
| 6,183,100 B1 | 2/2001 | Suckow et al. | 362/35 |
| 6,224,216 B1 | 5/2001 | Parker et al. | 353/31 |
| 6,259,608 B1 | 7/2001 | Berardinelli et al. | |
| 6,274,924 B1 | 8/2001 | Carey et al. | 257/676 |
| 6,296,367 B1 | 10/2001 | Parsons et al. | 362/183 |
| 6,330,111 B1 | 12/2001 | Myers | |
| 6,331,915 B1 | 12/2001 | Myers | |
| 6,331,944 B1 | 12/2001 | Monsma et al. | 365/171 |
| 6,359,236 B1 | 3/2002 | DiStefano et al. | |
| 6,376,902 B1 | 4/2002 | Arndt | 257/678 |
| 6,389,051 B1 | 5/2002 | Van de Walle et al. | 372/45.01 |
| 6,454,437 B1 | 9/2002 | Kelly | 362/246 |
| 6,469,321 B2 | 10/2002 | Arndt | |
| 6,480,389 B1 | 11/2002 | Shie et al. | 361/707 |
| 6,482,711 B1 | 11/2002 | Nguyen et al. | 438/317 |
| 6,504,179 B1 | 1/2003 | Ellens et al. | 257/88 |
| 6,517,218 B2 | 2/2003 | Hochstein | 362/294 |
| 6,526,082 B1 | 2/2003 | Corzine et al. | 372/46.01 |
| 6,573,580 B2 | 6/2003 | Arndt | |
| 6,610,563 B1 | 8/2003 | Waitl | |
| 6,614,058 B2 | 9/2003 | Lin et al. | |
| 6,614,170 B2* | 9/2003 | Wang et al. | 313/498 |
| 6,624,491 B2 | 9/2003 | Waitl et al. | |
| 6,653,765 B1 | 11/2003 | Levinson et al. | 313/112 |
| 6,657,393 B2 | 12/2003 | Natsume | |
| 6,680,490 B2 | 1/2004 | Yasukawa et al. | |
| 6,686,609 B1 | 2/2004 | Sung | |
| 6,707,069 B2 | 3/2004 | Song et al. | 257/79 |
| 6,710,373 B2 | 3/2004 | Wang | |
| 6,746,889 B1 | 6/2004 | Eliashevich et al. | |
| 6,759,733 B2 | 7/2004 | Arndt | |
| 6,770,498 B2 | 8/2004 | Hsu | 438/26 |
| 6,774,401 B2 | 8/2004 | Nakada et al. | |
| 6,784,463 B2 | 8/2004 | Camras et al. | |
| 6,791,259 B1* | 9/2004 | Stokes et al. | 313/503 |
| 6,858,879 B2 | 2/2005 | Waitl | |
| 6,870,311 B2 | 3/2005 | Mueller et al. | 313/491 |
| 6,872,585 B2 | 3/2005 | Matsumura et al. | |
| 6,876,149 B2 | 4/2005 | Miyashita | |
| 6,878,975 B2 | 4/2005 | Hueschen | 257/104 |
| 6,882,051 B2 | 4/2005 | Majumdar et al. | 257/746 |
| 6,900,511 B2 | 5/2005 | Ruhnau et al. | |
| 6,911,678 B2 | 6/2005 | Fujisawa et al. | |
| 6,914,268 B2 | 7/2005 | Shei et al. | 257/99 |
| 6,919,586 B2 | 7/2005 | Fujii | |
| 6,932,497 B1 | 8/2005 | Huang | |
| 6,940,704 B2 | 9/2005 | Stalions | |
| 6,946,714 B2 | 9/2005 | Waitl | |
| 6,949,774 B2 | 9/2005 | Parikh et al. | 257/104 |
| 6,975,011 B2 | 12/2005 | Arndt | |
| 6,995,510 B2 | 2/2006 | Murakami et al. | |
| 7,005,679 B2* | 2/2006 | Tarsa et al. | 257/89 |
| 7,021,797 B2 | 4/2006 | Minano et al. | 362/355 |
| 7,064,907 B2 | 6/2006 | Kaneko | |
| 7,066,626 B2 | 6/2006 | Omata | |
| 7,083,490 B2 | 8/2006 | Mueller et al. | 445/24 |
| 7,087,936 B2 | 8/2006 | Negley | |
| 7,102,213 B2 | 9/2006 | Sorg | |
| 7,119,422 B2 | 10/2006 | Chin | 257/666 |
| 7,161,189 B2 | 1/2007 | Wu | 57/98 |
| 7,224,000 B2 | 5/2007 | Aanegola et al. | 257/98 |
| 7,285,802 B2 | 10/2007 | Ouderkirk et al. | |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,491,626 B2 | 2/2009 | Gaska et al. | 438/483 |
| 7,791,092 B2* | 9/2010 | Tarsa et al. | 257/98 |
| 7,855,393 B2* | 12/2010 | Rosler et al. | 257/98 |
| 2002/0015013 A1 | 2/2002 | Ragle | |
| 2002/0054495 A1 | 5/2002 | Natsume | |
| 2002/0061174 A1 | 5/2002 | Hurt et al. | |
| 2002/0085601 A1* | 7/2002 | Wang et al. | 372/43 |
| 2002/0123163 A1 | 9/2002 | Fujii | |
| 2002/0163001 A1 | 11/2002 | Shaddock | |
| 2002/0171911 A1 | 11/2002 | Maegawa | |
| 2002/0180351 A1 | 12/2002 | Mc Nulty | |
| 2002/0195935 A1 | 12/2002 | Jager | |
| 2003/0015708 A1 | 1/2003 | Parikh et al. | |
| 2003/0038596 A1 | 2/2003 | Ho | 313/512 |
| 2003/0085409 A1 | 5/2003 | Shen | |
| 2003/0116769 A1 | 6/2003 | Song et al. | |
| 2003/0183852 A1 | 10/2003 | Takenaka | |
| 2003/0218183 A1 | 11/2003 | Micovic et al. | 257/192 |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0094757 A1 | 5/2004 | Braune et al. | |
| 2004/0126913 A1 | 7/2004 | Loh | |
| 2004/0206966 A1 | 10/2004 | Sugawara et al. | 257/85 |
| 2004/0207313 A1 | 10/2004 | Omoto et al. | |
| 2004/0217364 A1 | 11/2004 | Tarsa et al. | |
| 2004/0227149 A1 | 11/2004 | Ibbetson et al. | |
| 2004/0232435 A1 | 11/2004 | Hofer | |
| 2004/0238930 A1 | 12/2004 | Arndt | |
| 2005/0023548 A1 | 2/2005 | Bhat | |
| 2005/0072981 A1 | 4/2005 | Suenaga | |
| 2005/0077535 A1 | 4/2005 | Li | |
| 2005/0093005 A1 | 5/2005 | Ruhnau | |
| 2005/0117320 A1* | 6/2005 | Leu et al. | 362/31 |
| 2005/0122720 A1 | 6/2005 | Shimonaka et al. | 362/257 |
| 2005/0127377 A1 | 6/2005 | Arndt | |
| 2005/0135105 A1 | 6/2005 | Teixeira et al. | |
| 2005/0152127 A1 | 7/2005 | Kamiya et al. | |
| 2005/0173692 A1 | 8/2005 | Park et al. | |
| 2005/0173728 A1 | 8/2005 | Saxler | |
| 2005/0179376 A1 | 8/2005 | Fung et al. | |
| 2005/0189539 A1 | 9/2005 | Furukawa | |
| 2005/0224821 A1 | 10/2005 | Sakano et al. | 257/79 |
| 2005/0224829 A1 | 10/2005 | Negley | |
| 2006/0022212 A1 | 2/2006 | Waitl | |
| 2006/0049477 A1 | 3/2006 | Arndt | |
| 2006/0063289 A1 | 3/2006 | Negley | |
| 2006/0081862 A1 | 4/2006 | Chua et al. | |
| 2006/0102917 A1 | 5/2006 | Oyama et al. | |
| 2006/0108594 A1 | 5/2006 | Iwasaki et al. | |
| 2006/0133044 A1 | 6/2006 | Kim et al. | |
| 2006/0157828 A1 | 7/2006 | Sorg | |
| 2006/0158899 A1 | 7/2006 | Avabe et al. | |
| 2006/0220046 A1 | 10/2006 | Yu et al. | 257/98 |
| 2006/0244358 A1 | 11/2006 | Kim et al. | |
| 2007/0007558 A1 | 1/2007 | Mazzochette | 257/239 |
| 2007/0041101 A1 | 2/2007 | Goosey et al. | |
| 2007/0046176 A1 | 3/2007 | Bukesov et al. | |
| 2007/0090383 A1 | 4/2007 | Ota | |
| 2007/0109779 A1 | 5/2007 | Sekiguchi et al. | |
| 2007/0170449 A1 | 7/2007 | Anandan | |
| 2007/0269586 A1 | 11/2007 | Leatherdale | |
| 2008/0013319 A1 | 1/2008 | Pei et al. | |
| 2008/0036364 A1 | 2/2008 | Li et al. | |
| 2008/0074032 A1 | 3/2008 | Yano et al. | |
| 2008/0121921 A1 | 5/2008 | Loh et al. | |
| 2008/0186702 A1 | 8/2008 | Camras et al. | |
| 2008/0191232 A1 | 8/2008 | Lee et al. | |
| 2008/0303052 A1 | 12/2008 | Lee et al. | |
| 2008/0308825 A1 | 12/2008 | Chakraborty et al. | |
| 2009/0026908 A1 | 1/2009 | Bechtel et al. | 313/110 |
| 2009/0050908 A1 | 2/2009 | Yuan et al. | |
| 2009/0050911 A1* | 2/2009 | Chakraborty | 257/89 |
| 2009/0057699 A1 | 3/2009 | Basin et al. | |
| 2009/0072251 A1 | 3/2009 | Chan et al. | |
| 2009/0114938 A1* | 5/2009 | Hsu et al. | 257/98 |
| 2009/0129085 A1 | 5/2009 | Aizar et al. | |
| 2009/0189178 A1 | 7/2009 | Kim et al. | |
| 2009/0267090 A1 | 10/2009 | Chang et al. | |
| 2009/0283781 A1 | 11/2009 | Chan et al. | |
| 2010/0290221 A1* | 11/2010 | Tarsa et al. | 362/231 |
| 2011/0215347 A1 | 9/2011 | Wong et al. | |
| 2011/0266574 A1 | 11/2011 | Liao et al. | |

FOREIGN PATENT DOCUMENTS

| | | |
|---|---|---|
| CN | 2646873 | 10/2004 |
| CN | 1581527 A | 2/2005 |
| CN | 1679168 A | 5/2005 |
| CN | 1591924 A | 9/2005 |
| CN | 1801498 A | 7/2006 |
| CN | 1744335 A | 8/2006 |
| CN | 101061590 A | 10/2007 |
| EP | 0936682 | 8/1999 |
| EP | 1005085 A2 | 5/2000 |
| EP | 1187226 A1 | 3/2002 |
| EP | 1187227 | 3/2002 |
| EP | 1187228 | 3/2002 |
| EP | 1349202 A | 10/2003 |
| EP | 1 369 935 A1 | 12/2003 |
| EP | 1521313 | 4/2005 |
| EP | 1653255 | 5/2006 |
| EP | 1681509 | 7/2006 |
| EP | 1 737 050 A1 | 12/2006 |
| FR | 2586844 | 3/1987 |
| FR | 2759188 | 8/1998 |
| FR | 2814220 | 3/2002 |
| GB | 2420221 A | 5/2006 |
| JP | 03-171780 | 7/1991 |
| JP | H03-206672 | 9/1991 |
| JP | 06-177424 | 6/1994 |
| JP | 8139257 | 5/1996 |
| JP | 11-167805 A | 6/1999 |
| JP | 11-307813 | 11/1999 |
| JP | 2000223752 | 8/2000 |
| JP | 2002-057376 | 2/2002 |
| JP | 2005183193 | 7/2005 |
| JP | 2005524737 A | 8/2005 |
| JP | 2005-232305 | 9/2005 |
| JP | 2006-313902 | 11/2006 |
| JP | 2006-324331 | 11/2006 |
| JP | 2007-149909 | 6/2007 |
| JP | 2007-273763 | 10/2007 |
| JP | 2007-287981 | 11/2007 |
| JP | 2007-299905 | 11/2007 |
| WO | 9856043 | 12/1998 |
| WO | WO 9931737 | 6/1999 |
| WO | WO 0211212 A | 7/2002 |
| WO | 03044870 | 5/2003 |
| WO | 03080763 | 10/2003 |
| WO | WO 2004027882 | 1/2004 |
| WO | WO 2004044877 | 5/2004 |
| WO | WO 0217405 | 2/2005 |
| WO | WO 2005104247 | 3/2005 |
| WO | WO 2005043627 A1 | 5/2005 |
| WO | WO 2005/104247 | 11/2005 |
| WO | WO 2005104247 | 11/2005 |
| WO | 2006048064 A1 | 5/2006 |
| WO | WO 2006/048064 A1 | 5/2006 |
| WO | WO 2006054228 A2 | 5/2006 |
| WO | WO 2006054228 A3 | 5/2006 |
| WO | WO 2007/085977 | 1/2007 |
| WO | WO 2007005844 A | 1/2007 |
| WO | WO 2007/083408 A1 | 7/2007 |
| WO | WO 2009/074919 A1 | 6/2009 |
| WO | 2010070120 | 6/2010 |
| WO | 2011020098 | 2/2011 |
| WO | 2011118178 | 9/2011 |
| WO | 2012047505 | 12/2012 |
| WO | 2012047937 | 12/2012 |

OTHER PUBLICATIONS

Office Action from related China Application No. 200710142310.7, dated: Dec. 11, 2009.
First Office Action for Chinese Patent Application No. 200780019643.9 dated Mar. 29, 2010.
Notification of First Office Action in application CN 200880009255.7 mailed Sep. 26, 2010.
International Search Report and Written Opinion from application PCT/CN2010/001009 mailed Oct. 21, 2010.
International Search Report and Written Opinion from PCT/US2010/001852 mailed Nov. 11, 2010.
Appeal Decision in Japanese Design Patent Application No. 2009-002857 (Appeal No. 2010-002154) mailed Aug. 20, 2010.
Office Action from U.S. Appl. No. 11/149,998, dated: Nov. 20, 2009.
Response to Office Action from U.S. Appl. No. 11/149,998, dated: Feb. 22, 2010.
Office Action from U.S. Appl. No. 12/154.691, dated: Dec. 17, 2009.
Response to Office Action from U.S. Appl. No. 12/154.691, dated: May 17, 2010.
Office Action from U.S. Appl. No. 11/465.120, dated: Mar. 9, 2010.
Office Action from U.S. Appl. No. 12/152.766, dated: Mar. 12, 2010.
Office Action from U.S. Appl. No. 12/069.827, dated: Apr. 20, 2010.
Office Action from U.S. Appl. No. 12/321.059, dated: May 17, 2010.
Office Action from U.S. Appl. No. 11/149,998, dated: May 18, 2010.
International Search Report for PCT/CN2009/074800 mailed Feb. 25, 2010.
Declaration of Gerald Begley under 37 C.F.R.S 1.132, dated: Aug. 20, 2009.
Declaration of Charles Swoboda under 37 C.F.R.S 1.132, dated: Aug. 19, 2009.
JP 2001 060072A, Abstract, Matsushita Electric Ind. Co Ltd., Mar. 6, 2001.
Nichia Corp. White LED Part No. NSPW300BS, Specification for Nichia White LED, Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-002857, dated: Jul. 24, 2009.
Related U.S. Appl. No. 11/473,089, entitled "Close Loop Electrophoretic Deposition of Semiconductor Devices", Jun. 2006.
Related U.S. Appl. No. 11/656,759, entitled "Wafer Level Phosphor Coating Method and Devices Fabricated Utilizing Method.", Jan. 2007.
Related U.S. Appl. No. 11/899,790, entitled "Wafer Level Phosphor Coating Method and Devices Fabricated Utilizing Method", Sep. 2007.
Preliminary Notice of Reasons for Refusal re related Japanese Application No. 2009-002857, dated: Apr. 24, 2009, pp. 1-2.
Office Action from U.S. Appl. No. 11/895,573, mailed: Apr. 24, 2012.
Response to Office Action from U.S. Appl. No. 11/895,573, filed Aug. 13, 2012.
Office Action from U.S. Appl. No. 13/169,866, mailed: Apr. 24, 2012.
Response to Office Action from U.S. Appl. No. 13/169,866, filed Jul. 19, 2012.
Office Action from U.S. Appl. No. 11/895,573, mailed: Sep. 24, 2012.
Office Action from U.S. Appl. No. 12/151,089, mailed: Oct. 5, 2012.
Decision for Grant for Japanese Patent Application No. 2010-512143, Issued Jul. 3, 2012.
Notification of Second Office Action for Chinese Patent Application 200880100370.5, dated Feb. 22, 2012.
Notification of Reasons for Rejection for Japanese Patent Application No. 2009-112468 dated Oct. 18, 2011.
Final Rejection for Japanese Patent Application No. JP 2008-163311 issued Nov. 29, 2011.
Summary of Notice of Reasons for Rejection for counterpart Japanese Patent Application No. JP 2010-512143 mailed Jan. 10, 2012.
Office Action from U.S. Appl. No. 11/895,573, dated: Feb. 18, 2010.
Response to Office Action from U.S. Appl. No. 11/895,573, filed May 6, 2010.
Office Action from U.S. Appl. No. 11/895,573, dated: May 19, 2010.
Response to Office Action from U.S. Appl. No. 11/895.573, filed Oct. 19, 2010.
Office Action from U.S. Appl. No. 11/895,573, dated: Jan. 7, 2011.
Response to Office Action from U.S. Appl. No. 11/895,573, filed Jun. 24, 2011.
Office Action from U.S. Appl. No. 12/151,089, dated: Apr. 5, 2011.
Response to Office Action from U.S. Appl. No. 12/151,089, filed Jun. 24, 2011.

Office Action from U.S. Appl. No. 12/151,089, dated: Nov. 3, 2011.
Notice of Allowance from U.S. Appl. No. 11/818,818, dated: Mar. 29, 2011.
Extended European Search Report for European Patent Application No. 09159268.3 dated Aug. 22, 2011.
Notification of the First Office Action for Chinese Patent Application No. CN 200880100370.5 mailed Apr. 26, 2011.
Office Action for German Patent Application No. 10 2008 029 318.0 dated Oct. 19, 2010.
Office Action for Japanese Patent Application No. JP 2008-163311 issued Mar. 29, 2011.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.
Copending U.S. Appl. No. 11/443,741, date: Jun. 14, 2007.
Copending U.S. Appl. No. 11/685,761, date: Mar. 13, 2007.
US Copending U.S. Appl. No. 11/939,059, date: Nov. 13, 2007.
PCT Search Report and Written Opinion PCT/US2007/086237, date: May 8, 2008 in related application.
PCT Search Report and Written Opinion PCT/US2007/12403, date: Aug. 6, 2008.
PCT Search Report and Written Opinion PCT/US2007/086242, date: Mar. 4, 2008.
International Search Report for PCT/US2008/004453, date Sep. 9, 2008.
Written Opinion for PCT/US2008/004453, date Sep. 9, 2008.
Publication No. 2005/152127. Publication date Jul. 14, 2005.
Publication No. 2005/077535, Publication date Apr. 14, 2005.
Publication No. 2006/220046, Publication date Oct. 5, 2006.
Publication No. 2008/074032, Publication date Mar. 27, 2008.
Publication No. 2005/5117320, Publication date Jun. 2, 2005.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, Jan. 1, 2005, XP-001236966.
Notice Requesting Submission of Opinion re related Korean application No. 10-2004-7001033, dated: Mar. 9, 2009.
Zhang et al. "Comparison of GaN P-I-N. and Schottky Rectifier Performance", IEEE Transactions on Electron Devices, vol. 48. No. 3. Mar. 2001, pp. 407-411.
Sakai at al., "Experimental Investigation of Dependence of Electrical Characteristics on Device Parameters in Trench MOS Barrier Schottky Diodes", 1998, International Symposium on Power Semiconductor Devices & ICs, Kyoto, pp. 293-296.
European Search Report re related European Application No. 08253301.9-2222. Feb. 24, 2009.
European Search Report re related EP Appl. 08160129.6.2222, Dated: Dec. 15, 2008.
Asbeck et al. "Enhancement of Base Conductivity via the Piezoelectric Effect in AlGaN/GaN HBTs", Solid State Electronics. Elsevier Science Pub. Barking GB, vol. 44 No. 2, Feb. 1, 2000 pp. 211-219. XP004186190.

Johnson et al. "New UV Light Emitter Based on AlGaN Heterostructures with Graded Electron and Hole Injectors", Materials Research Society Symposium—Proceedings 2002 Materials Research Society US, vol. 743, 2002, pp. 481-486.
Simon et al. "Polarization-Induced 3-Dimensional Electron Slabs in Graded AlGaN Layers", Materials Research Society Symposium Proceedings 2006 Materials Research Society US. vol. 892, Nov. 28, 2005, pp. 417-422.
Official Notice of Final Decision of Rejection re: related Japanese Patent Appl. No. 2003-529535, Dated Jan. 6, 2006.
European Communication from related European Appl. 02 798 906.0-1235, dated Feb. 6, 2009.
Notice of First Office Action from related China Patent Application No. 200710142217.6, dated Jun. 22, 2009.
Official Communication from the EPO regarding related European Appl. 08253301.9, dated Nov. 17, 2009.
Second Office Action from related China Patent Application No. 200710142217.6, dated Nov. 6, 2009.
Office Action from related U.S. Appl. No. 11/600,617, Dated: Dec. 22, 2009.
Office Action from parent U.S. Appl. No. 11/818,818, Dated: May 11, 2010.
Response to Office Action, U.S. Appl. No. 11/818,818, Dated May 11, 2010. Response filed: Oct. 19, 2010.
Office Action from parent U.S. Appl. No. 11/818,818, Dated Dec. 9, 2009.
Response to Office Action, U.S. Appl. No. 11/818,818, dated Dec. 9, 2009, Response filed: Jan. 7, 2010.
International Search Report, PCT/JP2005/006959. Dated May 24, 2005.
International Search Report, PCT/IB03/01042, Dated Jul. 30, 2003.
Office Action from U.S. Appl. No. 11/974,431, dated: Apr. 14, 2010.
Response to Office Action from U.S. Appl. No. 11/974,431, filed Jul. 6, 2010.
Office Action from U.S. Appl. No. 11/173,035, dated: Apr. 1, 2010.
Response to Office Action from U.S. Appl. No. 11/173,035, filed Jun. 1, 2010.
European Search Report from related European Application No. 07254498.4, received on Feb. 11, 2010.
Office Action from patent U.S. Appl. No. 11/974,431, dated: Sep. 22, 2010.
Response to Office Action from U.S. Appl. No. 11/974,431, filed Nov. 9, 2010.
Office Action from U.S. Appl. No. 11/900,952, dated: Jul. 23, 2010.
Response to Office Action from U.S. Appl. No. 11/900,952, filed Dec. 22, 2010.
(From related application) Canadian Patent Application No. 2.454.310, Office Action dated Feb. 9, 2010.
Nichia Corp., White LED Part No. NSPW300BS, Specification for Nichia White LED, Model NSPW300BS Jan. 14, 2004.
Nichia Corp., White LED Part No. NSPW312BS, Specification for Nichia White LED, Model NSPW312BS Jan. 12, 2004.
Office Action from U.S. Appl. No. 11/982,275, dated: Aug. 20, 2010.
Response to Office Action from U.S. Appl. No. 11/982,275, filed Nov. 9, 2010.
Office Action from U.S. Appl. No. 11/173,035, dated: Oct. 6, 2010.
Examiners interview in response to Office Action from U.S. Appl. No. 11/173,035 mailed: Feb. 16, 2011.
Office Action from U.S. Appl. No. 11/900,952, dated: Feb. 26, 2010.
Response to Office Action from U.S. Appl. No. 11/900,952, filed May 26, 2010.
Office Action from U.S. Appl. No. 11/895,573, mailed Jul. 23, 2009.
Response to Office Action from U.S. Appl. No. 11/895,573, filed Oct. 23, 2009.
Office Action from U.S. Appl. No. 11/895,573, mailed Feb 18, 2010.
Office Action from U.S. Appl. No. 11/895,573, mailed May 19, 2010.
Response to Office Action from U.S. Appl. No. 11/895,573, filed Oct. 19, 2010.
Office Action from U.S. Appl. No. 11/895,573, mailed Jan. 7, 2011.
Office Action from U.S. Appl. No. 12/151,089, mailed Oct. 30, 2009.
Response to Office Action from U.S. Appl. No. 12/151,089, filed Feb. 1, 2010.
Office Action from U.S. Appl. No. 12/151,089, mailed May 11, 2010.

Response to Office Action from U.S. Appl. No. 12/151,089, filed Oct. 11, 2010.
Office Action from U.S. Appl. No. 11/982,275, dated Jan. 13, 2011.
Office Action from U.S. Appl. No. 11/974,431, dated Feb. 16, 2011.
Invitation to Submit Applicant's Opinion (Summary) and Examiner's Report to the Board (Summary) in Japanese Appeal Filing No. 2009-007421, Japanese Patent Appl. No. 2003-529535 dated Dec. 7, 2010.
Office Action in German Patent Appl. No. 10 2008 029 318.0 dated Oct. 19, 2010.
Office Action from U.S. Appl. No. 11/498,418, dated: Dec. 16, 2006.
Response to Office Action from U.S. Appl. No. 11/498,418, dated: Apr. 16, 2010.
Office Action from U.S. Appl. No. 11/498,418, dated: Sep. 15, 2010.
Response to Office Action from U.S. Appl. No. 11/498,418, dated: Dec. 13, 2010.
Notification of Reasons for Rejection from Japanese Patent Application No. 2009-112468, dated Nov. 1, 2012.
Third Office Action from Chinese Patent Application No 200880100370.5, dated Sep. 29, 2012.

* cited by examiner

LED PACKAGES WITH SCATTERING PARTICLE REGIONS

BACKGROUND OF THE INVENTION

1. Field of the Invention

The invention relates to light emitting devices (LED) packages and, more particularly, to white LED and multiple LED packages with scattering particles.

2. Description of the Related Art

Light emitting diodes (LED or LEDs) are solid state devices that convert electric energy to light, and generally comprise one or more active layers of semiconductor material sandwiched between oppositely doped layers. Typically, wire bonds are used to apply a bias across the doped layers, injecting holes and electrons into the active layer where they recombine to generate light. Light is emitted from the active layer and from all surfaces of the LED. A typical high efficiency LED comprises an LED chip mounted to an LED package and encapsulated by a transparent medium. The efficient extraction of light from LEDs is a major concern in the fabrication of high efficiency LEDs.

LEDs can be fabricated to emit light in various colors. However, conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowrey, "Multiple Encapsulation of Phosphor-LED Devices"]. The surrounding phosphor material "downconverts" the energy of some of the LED's blue light which increases the wavelength of the light, changing its color to yellow. Some of the blue light passes through the phosphor without being changed while a portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

A common type of LED packaging where a phosphor is introduced over an LED is known as a "glob-in-a-cup" method. An LED chip resides at the bottom of a cup-like recession, and a phosphor containing material (e.g. phosphor particles distributed in an encapsulant such as silicone or epoxy) is injected into and fills the cup, surrounding and encapsulating the LED. The encapsulant material is then cured to harden it around the LED. This packaging, however, can result in an LED package having significant variation of the color temperature of emitted light at different viewing angles with respect to the package. This color variation can be caused by a number of factors, including the different path lengths that light can travel through the conversion material. This problem can be made worse in packages where the phosphor containing matrix material extends above the "rim" of the cup in which the LED resides, resulting in a predominance of converted light emitted sideways into high viewing angles (e.g., at 90 degrees from the optic axis). The result is that the white light emitted by the LED package becomes non-uniform and can have bands or patches of light having different colors or intensities.

Another method for packaging or coating LEDs comprises direct coupling of phosphor particles onto the surfaces of the LED, also referred to as conformal coating. Electrophoretic deposition, screen printing, spin coating can be used to make conformal coating. These methods can result in improvement of the color uniformity as a function of viewing angle with one reason for this improvement being the source of the converted light and unconverted light being as close to the same point in space. For example, a blue emitting LED covered by a yellow converting material can provide a substantially uniform white light source because the converting material and LED are close to the same point in space. However, the color uniformity still suffers from phosphor concentration or phosphor thickness variations and differences in path length.

Inconsistencies in emission profile can also be the result of the angles of emission from an LED. FIG. 1a illustrates a cross-section of a known light emitting device or package. A light source, such as an LED 102, is disposed on a substrate/submount 104 and a layer of downconverting material 106 covers the LED 102. A reflector 108 is disposed around the LED 102 on the substrate 104 such that the LED 102 is housed in a cavity defined by the reflector 108 and the substrate 104, and a hemispherical encapsulant or lens 110 is disposed over the light source 102. The encapsulant 110 may be mounted over the light source 102 using an epoxy adhesive, for example, although other mounting methods may also be used. Light scattering particles 112 are disposed throughout the encapsulant 110.

It is noted that throughout the application reference is made to viewing angle and emission angles. The viewing angle is the angle at which an LED or LED package is viewed and is shown as exemplary $\theta_v$ in FIG. 1a. The viewing angle is measured from the optic axis which in this case runs through the center of the hemispherical encapsulant 110 and is perpendicular to the emitter 102. A viewing angle of zero degrees (0°) indicates that the output from the encapsulant is being viewed (or measured) from a point outside the encapsulant that is directly opposite the emitter 102, i.e., on-axis. The viewing angle increases as the device is tilted with respect to the viewer. A viewing angle of ninety degrees (90°) indicates that the output is being measured from an angle that is perpendicular to the optic axis and even with the flat edge of the encapsulant 110, i.e., directly from the side.

The emission angle is the angle at which light emits from an LED or LED package and is shown as $\theta_e$ in FIG. 1a. The emission angle shares the same optic axis with the viewing angle and it measures the angle from the optic axis at which a light ray initially propagates in the encapsulant 110 after it is emitted from the LED. A light ray that initially propagates from the emitter 102 along the optic axis (e.g., ray $R_1$) has an emission angle of 0°. As shown ray $\theta_e$ is approximately forty degrees (40°). The emission angle increases as the direction of initial propagation deviates from the optic axis. An important difference between the two angles is that the output profile at a given viewing angle is affected by scattering events inside the encapsulant 110, whereas the emission angle describes the direction of the light as it is initially emitted from the source or LED before it can interact with materials within the encapsulant.

Light rays R1-R4 shown in FIG. 1a model the paths of exemplary photons that are emitted from the LED 102. As shown, R1 is emitted and passes through a length ($l_1$) of the downconverting material 106 where there is a probability that a photon experiences a wavelength conversion. It is noted that the probability that a photon will be downconverted (i.e., absorbed and re-emitted) increases with the distance that the photon travels through the downconverting material 106. Thus, R2 which travels a greater distance ($l_2$) through the downconverting material 106 has a greater chance of being downconverted. It follows that, depending on the shape of the downconverting layer, the percentage of light that experiences a downconversion upon passing through the downconverting layer 106 is a function of the angle of emission from the source 102.

Without light scattering particles, the emission spectrum can exhibit a non-uniform emission pattern, producing a emission with variances in color temperature and intensity often noticeable to the human eye. Such non-uniformities can render a light emitting device undesirable for certain applications. After passing through the downconverting material 106, the light enters the encapsulant 110. The light scattering particles 112 distributed throughout the encapsulant 110 are designed to redirect the individual photons before they are emitted to randomize the point where the photons exit the encapsulant 110. This has the effect of improving spatial color temperature uniformity. For example, R1 collides with a light scattering particle, changes direction, and is emitted as shown. R1 exits the encapsulant 110 at a different point than it would have if no scattering particles were present. R3 experiences multiple scattering events. R2 and R4 pass through the encapsulant unimpeded. Thus, the light scattering particles randomize (to a certain degree) the point at which emitted photons exit the encapsulant 110 by disassociating the photons from their initial emission angle.

LED packages can also be provided with multiple LEDs and often the LEDs in the same package can emit different colors. For example, red, green and blue emitting LEDs can be used in combination to form a white light package (solid state RGB). Other multi-chip combinations are also common, such as the solid state RGGB which comprises one red chip, one blue chip and two green chips per unit. Phosphor conversion layers may be used in conjunction with these multi-chip devices, for example, the phosphor converted RGB which is used for high Color Rendering Index applications. Another known device consists of a phosphor converted white LED and a solid state red chip. Other combinations of phosphor converted colored chips and solid state chips are also known in a multi-chip LED package. Scattering particles can also be used in multiple chip LED packages to help mix the different colors of light.

Light scattering particles, however, can also reduce the LED package's emission efficiency. Scattering particles of varying sizes are typically spread throughout the lens, such that many different wavelengths of light are scattered, even some of which do not need scattering. This can result in unnecessary backscattering and absorption of the light that need not be scattered, which can result in unacceptable losses in emission efficiency.

SUMMARY OF THE INVENTION

The present invention is directed to emitter packages having scattering particles engineered to scatter target wavelengths or wavelength ranges of light from an emitter based on the emission profile of the emitter. The scattering particles are arranged to mix the light from the emitter so that the emitter package provides a more uniform light when viewed at different viewing angles. The present invention can be used in LED packages, and can provide different scattering particles in various regions around the LED to scatter target wavelengths of light emitting from the LED at a particular emission angles. This arrangement also provides for mixing of the LED light while minimizing the emission efficiency losses resulting from the scattering.

One embodiment of an LED package according to the present invention comprises at least one LED that emits LED light in an LED emission profile. The LED package also includes a first plurality of scattering particles to scatter a first target wavelength and a second plurality of scattering particles to scatter a second target wavelength that is different from the first target wavelength. The first and second scattering particles are arranged around the LED to scatter the LED light to improve the uniformity of the emission profile while minimizing the light loss.

Another embodiment of an emitter package, according to the present invention comprises at least one emitter that emits light in an emitter emission profile. It also includes a first region of first scattering particles and a second region of second scattering particles. The first and second regions are arranged around the at least one emitter to improve the emission uniformity of the emitter package compared to the emission profile of the emitter emission profile.

Another embodiment of an LED package according to the present invention comprises at least one LED that emits light in an LED emission profile. If also includes a first plurality of scattering particles having a first particle size distribution to scatter a first target wavelength range, and a second plurality of scattering particles having a second size distribution to scatter a second target wavelength range. Each of the first and second scattering particles is arranged in respective regions around the LED.

Still another embodiment of an LED package according to the present invention comprises at least one LED that emits light in an LED emission profile. The package also includes first and second scattering features, wherein the first scattering feature scatters a first target wavelength of light and the second scattering feature scatters a second target wavelength. Each of the first and second scattering features is arranged around the LED to scatter light from the LED based on the LED emission profile such that the LED package emits a package emission profile having improved uniformity compared to the LED emission profile.

DETAILED DESCRIPTION OF THE INVENTION

Figure 1:
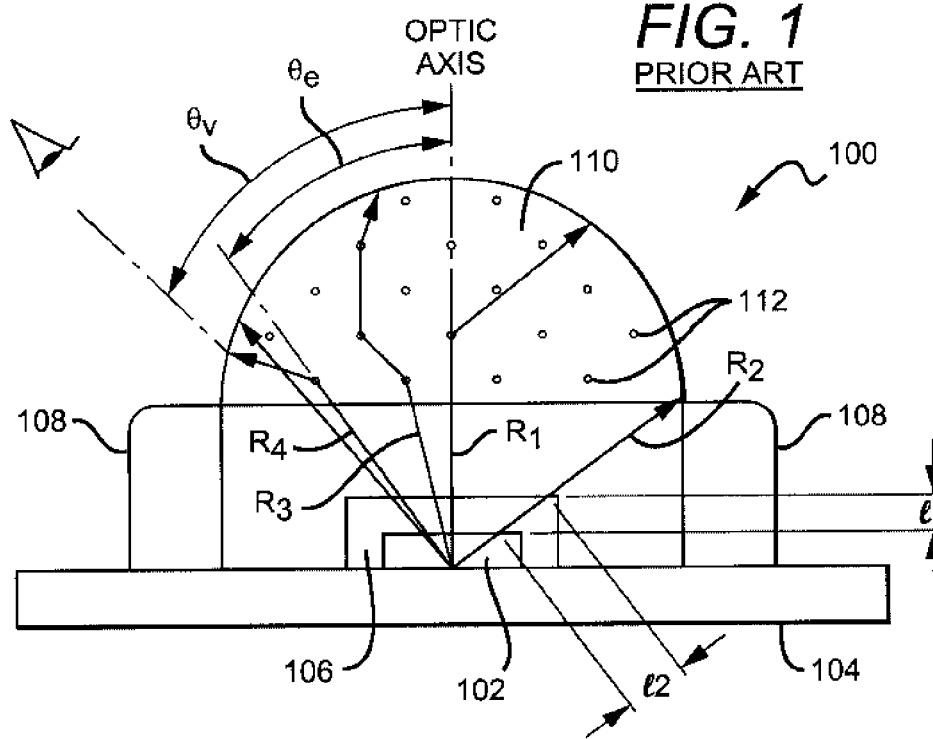
FIG. 1 is a cross sectional view of an emitting device in the prior art.

The present invention provides emitter packages exhibiting improved color emission uniformity and improved spatial color mixing for both single and multi-emitter packages. The embodiments are particularly well suited to packages using light emitting diodes (LED or LEDs) as their emitters, with many packages using white light emitting diodes (LEDs) or using multi-colored LEDs that emit a white light combination. The LED packages can comprise scattering particles arranged in different ways around the LED to scatter target wavelengths or wavelength ranges ("target wavelength") of light based on the emission profile of the LED so that the LED package provides a more uniform light at different viewing angles.

As described in more detail below, for LED packages having white light emitting LEDs comprising a blue LED covered by yellow phosphor, the white light correlated color temperature (CCT) is typically higher near the normal emission angle (defined as 0 degrees with respect to the line perpendicular to the chip center) and lower closer to 90 degrees from normal. Some embodiments of the present invention provide different scattering particles in respective regions of particles to scatter target wavelengths of light. For packages according to the present invention that have white emitting LEDs, a region of scattering particles designed to scatter primarily blue photons of light is arranged at the LED's emission angle at or around 0 degrees. In some embodiments this blue scattering region can cover a range of emission angles off normal up to as much as 45 degrees or more off normal. For angles of emission closer to 90 degrees, scattering particles can be provided designed to scatter primarily yellow photons of light. The yellow scatting particles can also cover a range of emission angles closer to 90 degrees, such as the range of up to 45-90 degrees or more.

By having regions of scattering particles engineered to primarily scatter photons of light at a target wavelength, the correlated color temperature (CCT) of the package at different viewing angles can be more uniform, and the emission efficiency of the package can be improved compared to conventional packages with scattering particles uniformly distributed around the LED. The different scattering particle regions are arranged to primarily scatter the particular target wavelength of light emitting at the particular emission angles (e.g. blue light close to normal and at low emission angles and yellow light at high emission angles). The scattering particles are designed to scatter their particular target wavelength, with the other wavelengths preferably passing with none or minimal scattering. In conventional LED packages many different wavelengths of light can be affected by the scattering particles, including the target wavelengths and non-target wavelengths. By allowing non-target photons to pass without being significantly scattered, the emission efficiency of LED packages according to the present invention can be improved over convention LED packages.

To scatter target photons or wavelengths of light, each of the scattering particle regions can have different sizes or types of scattering particles. In one embodiment the regions can contain scattering particles made of the same material, but with different sizes depending on the target wavelength for the region. As further described below, the different regions should also have relative narrow particle size distribution, which further allows the particles to scatter primarily the target wavelength.

The way that particles interact with light at a given wavelength or in a given wavelength range is a product of both the particle size and the refractive quality of the material (indicated by the index of refraction). The scattering function to randomize the emitted light by causing it to deviate from the path along which it was initially emitted from the source, providing improved color temperature uniformity and color-mixing over the entire range of viewing angles. Similarly, scattering particles can be arranged to intentionally create a non-uniform color temperature profile for specialized applications. In the context of the present invention, there are generally three ways that scattering particles scatter light: reflection, refraction and diffraction.

Reflection is the change in direction of light at an interface between media having different indices of refraction so that the light returns into the medium from which it originated. As light traveling in a medium reaches an interface with another material having a different index of refraction, the light can be deflected or reflected back into the medium. In the case of scattering particles, the light can be deflected back in the direction it came from or at an angle, depending on the geometry. For purposes of scattering light that will eventually be emitted, forward or slightly sideways scattering is preferred so that the amount of light reflected backwards (backscattering) towards absorbent materials is reduced.

Light may also be scattered by refraction. Refraction is the change in direction of light due to a change in phase velocity (i.e., the speed a wave propagates in a medium). In this context, refraction takes place when light travels from one medium to another medium having a different index of refraction. In one embodiment, light is emitted into an encapsulant medium where it interacts with LSPs distributed throughout the medium. As the light enters the LSPs, it changes speed, resulting in a change of direction, scattering.

Light can also be scattered by diffraction. Diffraction is the bending of light around an object or an aperture due to the wave-like characteristics of light. As light passes close by an object, for example an LSP, the light bends around the object, deviating from its original path as it was approaching the object. With large objects the bending effect is barely noticeable. However, as the size of the object approaches the wavelength of the incident light, the phenomenon becomes significant. In this context, when the size of the LSPs approaches one half the wavelength of the incident light, the light can bend approximately five times as much light as light that actually strikes the object. Thus, with an appropriately sized scattering particle, the diffraction area around the particle can be increased to approximately five times the diameter of the particle. To take advantage of the increased diffraction cross-section, the size of the scattering particle should be carefully chosen for light having a particular wavelength range or sub-range.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although most of the devices discussed herein are designed to emit radiation in the visible spectrum, some devices may emit radiation in the infrared, ultraviolet, or other ranges. The term "light" is used for convenience and should not be construed to exclude emission in ranges or sub-ranges outside the visible spectrum unless explicitly stated otherwise.

Although the terms first, second, etc. may be used herein to describe various elements, components, regions, layers and/or sections, these elements, components, regions, layers and/or sections should not be limited by these terms. These terms are only used to distinguish one element, component, region, layer, section or characteristic from another. Thus, a first element, component, region, layer, section or characteristic discussed below could be termed a second element, component, region, layer, section or characteristic without departing from the teachings of the present invention.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote a homogenous layer of material. A single "layer" may contain various scattering material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions or particles illustrated herein, but are to include deviations in shapes that result, for example, from manufacturing. A region illustrated or described as rectangular, for example, will typically have rounded or curved features due to normal manufacturing tolerances. Thus, the regions illustrated in the figures are schematic in nature and their shapes are not intended to illustrate the precise shape of a region or particle and are not intended to limit the scope of the invention. Further, the sizes of certain features may not be to scale. As an example, the sizes of the scattering particles in the figures below may not be to scale, and may be shown out of scale for illustrative purposes and ease of understanding.

Figure 2:
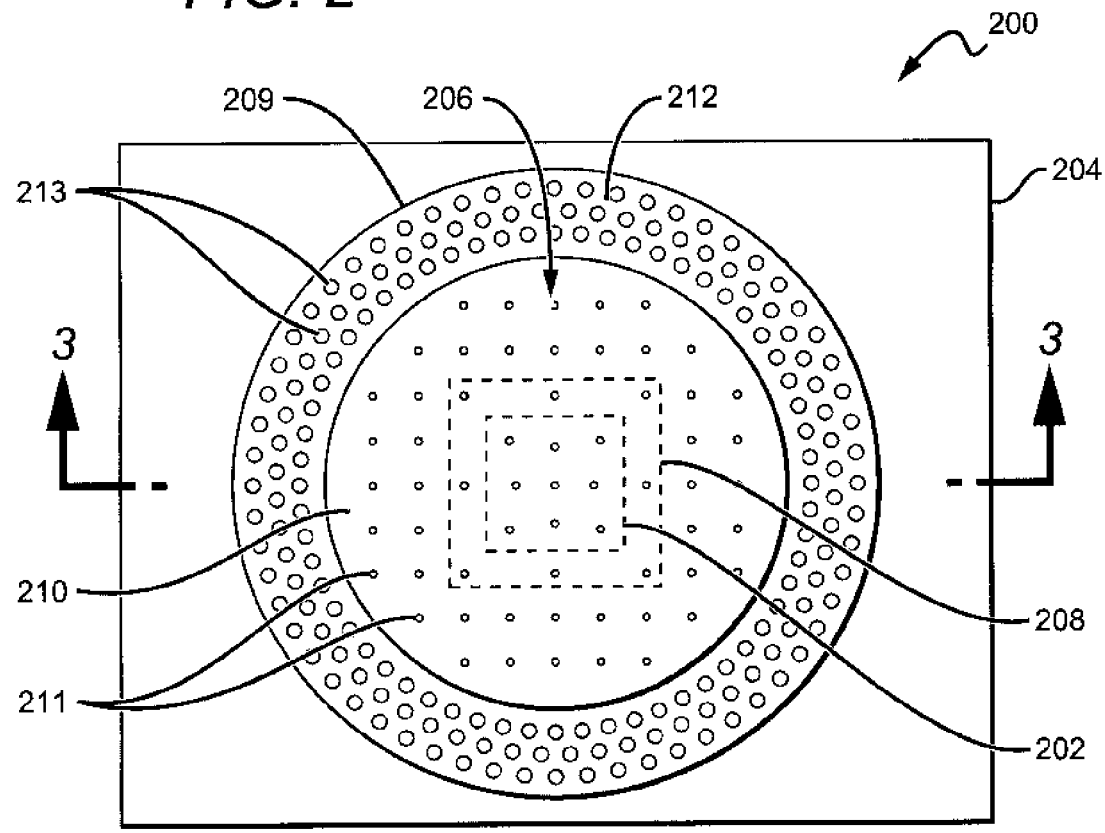
FIG. 2 is a plan view of one embodiment of an LED package according to the present invention.
Figure 3:
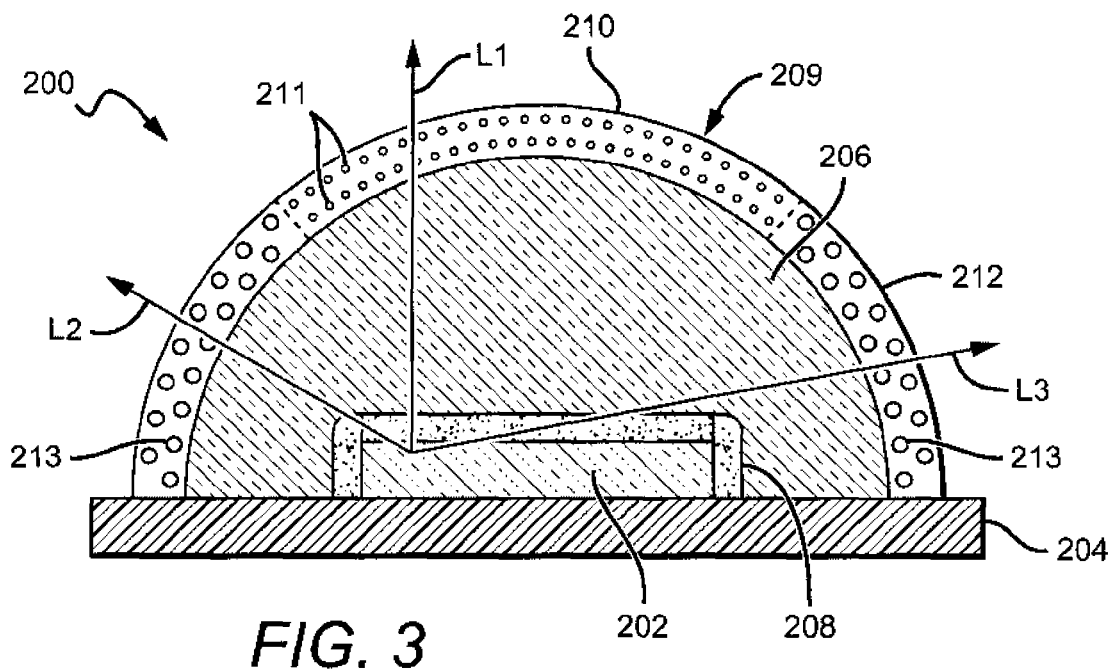
FIG. 3 is a sectional view of the LED package in FIG. 3, taken along section lines 3-3.

FIGS. 2 and 3 show one embodiment of an emitter package 200 according to the present invention. Emitter 202 is disposed on a surface 204 that can comprise a submount, substrate or a printed circuit board ("submount"). In the embodiment shown the emitter 202 is an LED, but it is understood that other emitters can be used such as a vertical cavity surface-emitting laser (VCSEL), or another type of emitting device.

The operation of LEDs is generally known and different methods of LED fabrication are generally known and only briefly discussed herein. The layers of the LED can be fabricated using known processes with a suitable process being fabrication using metal organic chemical vapor deposition (MOCVD). The layers of LEDs can comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

It is also understood that additional layers and elements can also be included in LEDs, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such at sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

The LEDs can also comprise a conductive current spreading structure and wire bond pads on the top surface, both of which are made of a conductive material and be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on the LEDs with the fingers spaced to enhance current spreading from the pads into the LED's top surface. In operation, an electrical signal is applied to the pads through a wire bond as described below, and the electrical signal spreads through the fingers of the current spreading structure and the top surface into the LEDs. Current spreading structures are often used in LEDs where the top surface is p-type, but can also be used for n-type materials.

LEDs can also be coated with one or more phosphors with the phosphors absorbing at least some of the LED light and emitting a different wavelength of light such that the LED emits a combination of light from the LED and the phosphor. In one embodiment according to the present invention the white emitting LEDs have an LED that emits light in the blue wavelength spectrum and the phosphor absorbs some of the blue light and re-emits yellow. The LEDs emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:

$Tb_{3-x}RE_xO_{12}$:Ce (TAG); RE=Y, Gd, La, Lu; or
$Sr_{2-x-y}Ba_xCa_ySiO_4$:Eu.

LEDs can also comprise layers and material that permit emission of a different color directly from the active region. For example, red emitting LEDs can comprise LED structures and materials that permit emission of red light directly from the active region. Alternatively, the red emitting LEDs can comprise LEDs emitting blue or UV light covered by a phosphor that absorbs the LED light and emits a red light. Some phosphors appropriate for these structures can comprise the following:

$Lu_2O_3$:$EU^{3+}$ $(Sr_{2-x}La_x)(Ce_{1-x}Eu_x)O_4$ $Sr_2Ce_{1-x}Eu_xO_4$ $Sr_{2-x}Eu_xCeO_4$ $SrTiO_3:Pr^{3+}, Ga^{3+}$ $CaAlSiN_3:Eu^{2+}$ $Sr_2Si_5N_8:Eu^{2+}$

The LEDs can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submount 204 can be formed of many different materials with a preferred material being electrically insulating, such as a dielectric element, with the submount being between the LED array and the component backside. The submount 204 can comprise a ceramic such as alumina, aluminum nitride, silicon carbide, or a polymeric material such as polymide and polyester etc. In the preferred embodiment, the dielectric material has a high thermal conductivity such as with aluminum nitride and silicon carbide. In other embodiments the submount 204 can comprise highly reflective material, such as reflective ceramic or metal layers like silver, to enhance light extraction from the component. In other embodiments the submount 204 can comprise a printed circuit board (PCB), alumina, sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

Wire bonds (not shown) can be included between the conductive traces on the submount 204 and the LED 202 to apply an electrical signal to the LED 202. An electrical signal can also be applied to each of the LEDs through a die attach pad. In other embodiments, the LEDs can comprise coplanar electrical contacts on one side of the LED (bottom side) with the majority of the light emitting surface being located on the LED side opposing the electrical contacts (upper side). Such flip-chip LEDs can be mounted onto the submount 204 by mounting contacts corresponding to one electrode (anode or cathode, respectively) onto the die pad. The contacts of the other LED electrode (cathode or anode, respectively) can be mounted to electrical traces. An optional reflector (not shown) can be included that is mounted to submount around the LED. In other embodiments the reflector can be arranged in different locations and can be shaped differently. The LED package 200 is provided without a reflector.

An encapsulant or optical element 206, such as a lens, can be included over the LED 202. The lens 206 can be formed in many different ways such as molding or injection of curable lens material over the LED and then curing of the material. The lens material can comprise transparent epoxy, silicone, glass, plastic or any other transparent medium. Alternatively, the lens 206 can be provided a separate piece part that can be bonded in place. The lens can have many different shapes and can comprise components to enhance light extraction. It is understood that other embodiments of the invention can be provided without a lens. The suitable shape for the lens 206 is hemisphere, having a curved surface and a flat surface. However, many other lens shapes can also be used such as a flat shape or planoconvex.

LEDs that can be used in embodiments of LED packages according to the present invention can emit a spectrum of wavelengths of light at different emission angles such that when the LED package can appear to be emitting different colors of light at different viewing angles. In one such embodiment, the LED 202 can be coated by a conversion material 208. Light emits from the active region of the LED 202 omnidirectionally and depending on its direction of travel can pass through different amounts of conversions material. This can result in different colors of light at different viewing angles. Light rays L1-L3 model how some of the LED light can emit from the active region. L1 represents an LED ray that emits up from the LED's active region at a low emission angle, with L1 passing through the layer of conversion coating 208 on the top surface of the LED 202. Similar light rays emitting up from active region at low emission angles pass through a similar amount of conversion material represented by the thickness of conversion coating 208 on the top surface of the LED 202. These rays emit a similar color of light, which is typically a combination of LED light and light re-emitted from the conversion material.

Light ray L2 emits from the LED's active region at a higher emission angle, and because of this angle encounters more conversion material as it passes through the conversion coating 208. As a result, more of the LED light emitting along L2 will be converted by the conversion material compared to that emitting on L1. Light ray L3 emits from the LED's active region at even a higher emission angle, causing it to pass through even a greater amount of conversion material. This increases the likelihood that light emitting along L3 will be converted.

For an LED having a conversion coating comprising a yellow conversion material, such as one of the materials listed above, the light rays emitting at higher emission angles can pass through greater amounts of conversion material. The light emitting from the package at higher emission angles can comprise a higher yellow light component from the conversion material compared to light emitting at lower emission angles (e.g. light ray L1). This can result in light from the LED package 200 exhibiting different colors when viewed at different viewing angles, with the light being more yellow at high viewing angles and more blue at low viewing angles.

This difference in color over the different viewing angles can be compensated for by providing scattering particles to mix the light as it emits from the package. As mentioned above, conventional LED packages used scattering particles of varying sizes distributed uniformly around the LED. This can result in different wavelengths of light scattered at different angles, including those wavelengths that were not intended to be scattered. This often resulted in a significant decrease in emission efficiency from the LED package.

LED packages according to the present invention are arranged with regions having scattering particles to scatter target wavelength of light emitting from LED at different emission angles. For LED package 200, a layer scattering particles 209 is provided on the lens 206, and comprises a first scattering particle region 210 that covers a range of low emission angles from the LED 202, and a second scattering particle region 212 that covers a range of high emission angles of the LED 202. By "covering" these emission angles, the different scattering particles regions are arranged so that light at particular emission angle ranges passes through the desired scattering particle region. For example, light emitting from the LED 202 within the particular range of low emission angles passes through the first scattering particle region 210. Light emitting from the LED 202 within a particular range of high emission angles passes through the second scattering particle region 212.

In one embodiment the first region can be arranged to the LED emitting with 0 to 45 degree emission angle passes through the first region 210, and light emitting with a 45 to 90 degree emission angle passes through the second region 212. It is understood that the first and second regions can be arranged in many different ways so that light emitting at different emission angles pass through the desired region.

The scattering particle layer 209 can be deposited using many different known methods, and can comprise scattering particles within a binder. The scattering particle layer can have different concentrations of scattering particles depending on the application and materials used. A suitable range for scattering particle concentration ranges from 0.01% to 0.2%, but it is understood that the concentration can be higher or lower than this range. In some embodiments the concentration can be as low as 0.001%. Other concentrations can be used; however, there can be an increase in loss due to absorption higher concentrations of the scattering particles. Thus, the concentrations of the scattering particles should be chosen in order to maintain an acceptable loss figure.

The first and second regions 210, 212 contain scattering particles designed to scatter a respective target wavelength or wavelength range ("target wavelength"). Each region can have a particular scattering particle size and/or material to scatter the target emission. It is understood that scattering particles are typically provided with a particular size distribution (e.g. D50 designation), and according to the present invention, to most efficiently scatter the target wavelength scattering particles in each region should be provided within a narrow particle size distribution. This reduces the scattering of light that is outside the target wavelength, which helps maximize the emission efficiency of the LED package while providing for a more uniform light emission.

For LED package 200, light emitting at low emission angles can comprise a greater blue light component as described above. Accordingly, the first emission region 210 can comprise first scattering particles 211 having a size and made of a particular material designed to scatter blue wavelengths of light. Similarly, light emitting from the LED package at higher emission angles can comprise a greater yellow light component from the conversion material. The second emission region 212 can comprise second scattering particles 213 having a size and made of a material designed to scatter yellow wavelengths of light.

The first and second scattering particles 211, 213 can comprise many different materials, including:
  silica gel;
  zinc oxide (ZnO);
  yttrium oxide ($Y_2O_3$);
  titanium dioxide ($TiO_2$);
  barium sulfate ($BaSO_4$);
  alumina ($Al_2O_3$);
  fused silica ($SiO_2$);
  fumed silica ($SiO_2$);
  aluminum nitride;
  glass beads;
  zirconium dioxide ($ZrO_2$);
  silicon carbide (SiC);
  tantalum oxide ($TaO_5$);
  silicon nitride ($Si_3N_4$);
  niobium oxide ($Nb_2O_5$);
  boron nitride (BN); or
  phosphor particles (e.g., YAG:Ce, BOSE)

Other materials not listed may also be used. Various combinations of materials or combinations of different forms of the same material may be used to achieve a particular scattering effect. For example, in one embodiment the first scattering particles 211 can comprise alumina and the second scattering particles 213 can comprise titanium dioxide. It is understood that each of the regions 210, 212 can also comprise mixtures of scattering particles made of different materials.

Figure 4:
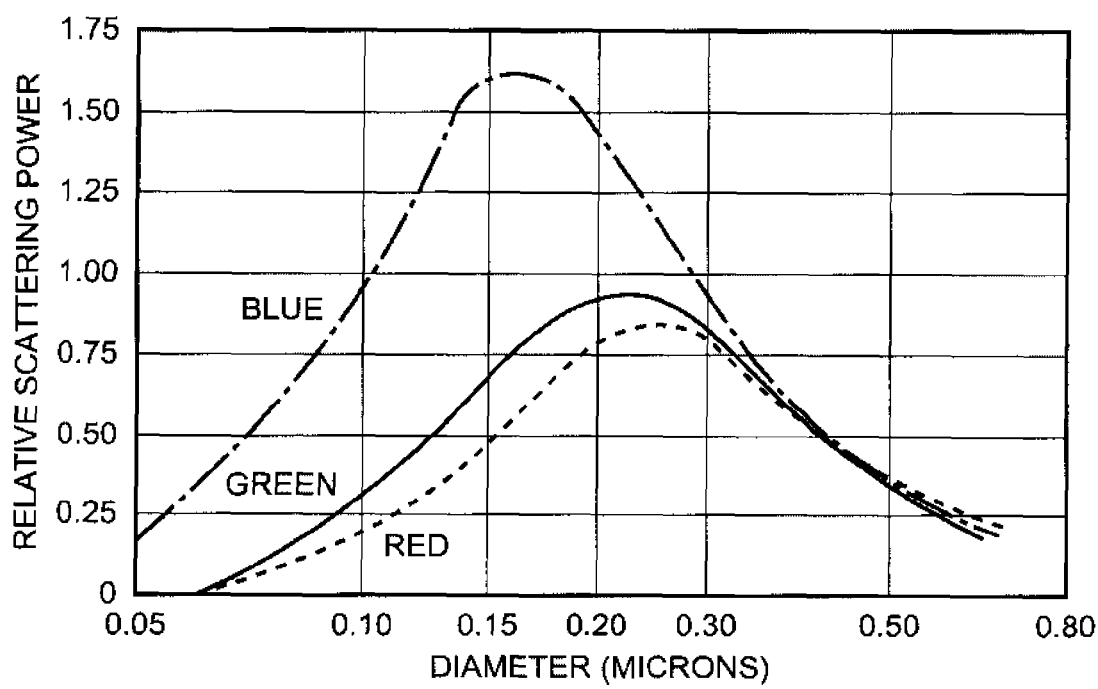
FIG. 4 is a graph showing the scattering power for different size scattering particles based on wavelength of the light to be scattered.

FIG. 4 is a graph showing the relative light scattering power verses the scattering particle size for $TiO_2$ scattering particles commercially available from different sources, such as from DuPont, Inc. For blue wavelengths of light, the peak scattering power is provided by scattering particles having approximately 0.15 micron diameter. The scattering power for yellow light is closely approximated by the scattering power of $TiO_2$ for green light, and the peak scattering power is provided by scattering particles having an approximately 0.25 micron diameter. For LED package 200, the first scattering particles 211 can comprise $TiO_2$ particles with an approximate 0.15 micron diameter and the second scattering particles 213 can comprise the same material with an approximate 0.25 micron diameter.

As mentioned above, the first and second scattering particles can comprise different materials which can result in certain advantages. Depending on the particular materials, the scattering distribution can be separated by the intrinsic material properties in addition to particle size.

As mentioned above, the particle size distribution should be as narrow as possible in each region to most efficiently scatter the target wavelength, while minimizing the scattering of other wavelengths. In one embodiment, the size distribution should be 50 percent or less, while in other embodiments it should be 33 percent or less. In one embodiment, the first scattering particles 211 can range in size from 0.10 to 0.20 microns (i.e. 0.15 microns±0.05 microns), and the second scattering particles 213 can range in size from 0.20 microns to 0.30 microns (i.e. 0.25 microns±0.05 microns). It is understood that other more or less narrow particle size distributions can be used, and in some embodiments it is desirable to have little or no overlap in particle size between the different scattering particle regions.

In LED package 200, the transition between the first and second regions 210, 212 is shown as abrupt and distinct, such that there are no first scattering particles 211 in the second region 212, and no second scattering particles 213 in the first region 210. It is understood, however, that in other embodiments the transition between the regions can also be gradual with some overlap between the particle sizes.

By scattering target wavelength at the different emission angles, the overall emission uniformity of LED packages can be improved over the emission profiles of the LED or LEDs in the package, while minimizing efficiency losses. That is, the profile of the LED light is made more uniform by passing through the scattering particles that scatter primarily at the target wavelengths.

Figure 5:
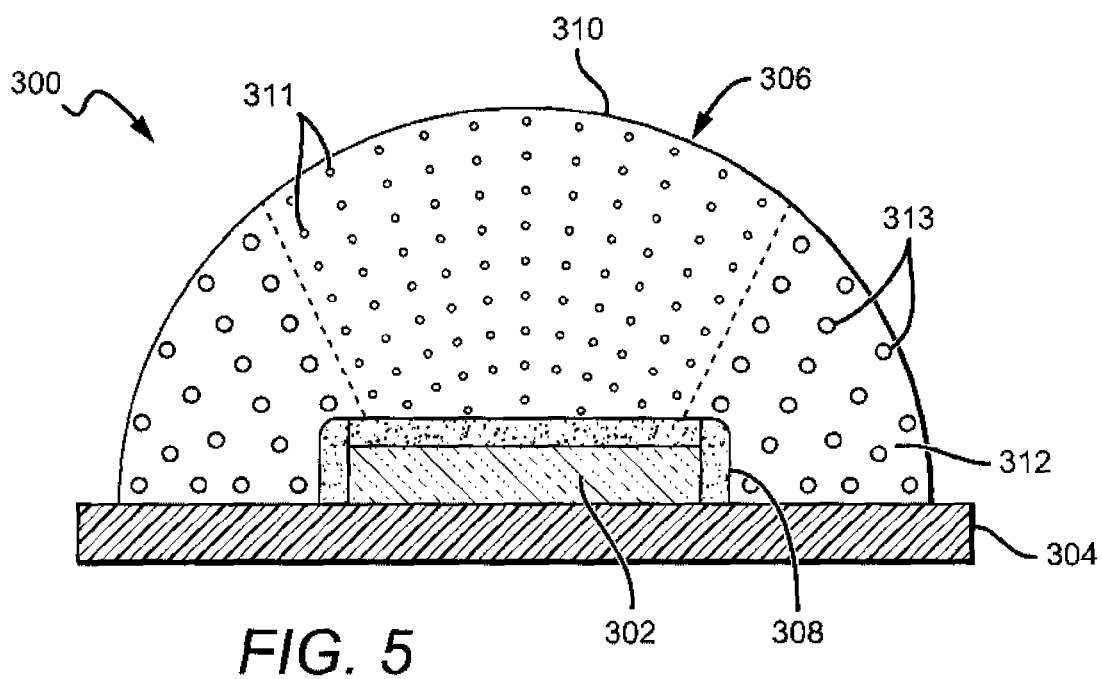
FIG. 5 is a sectional view of another embodiment of an LED package according to the present invention.

For LED package 200, the scattering particles are provided as a layer on the lens 206, but it is understood that the scattering particles can be proved in many different arrangements. FIG. 5 shows another embodiment of an LED package 300 that is similar to LED package 200 described above and shown in FIGS. 2-3. It comprises an LED 302, submount 304, lens 306 and a conversion coating 308 over the LED 302. Like LED package 200, the LED package 300 also comprises a first scattering particle region 310 having first scattering particles 311, and a second scattering particle region 312 having second scattering particles 313. For LED package 300 the regions are not provided as a layer, but instead comprise regions of scattering particles within the lens 306. The first scattering particle region 310 is arranged generally over the top of the LED 302 and covers light emitting from the LED 302 at low emission angles. The second scattering particle region 312 is arranged over the sides of the LED 302 and generally covers the light emitting from the LED at high emission angles. In one embodiment, the first region 310 can be arranged to cover emission angles from the LED in the range of approximately 0 to 45 degrees, and the second region 312 can be arranged to cover emission angles in the range of approximately 45-90 degrees. It is understood, however, that the regions 310, 312 can be arranged to cover different emission angles. The first and second scattering particles 311, 313 can comprise the sizes and materials described above, and there can be an abrupt or gradual transition between the regions 310, 312 as described above. The scattering particle regions in the lens can be formed during formation of lens over the LED or the lens formed separately, such as by injection molding, with the difference scattering particle regions.

Figure 6:
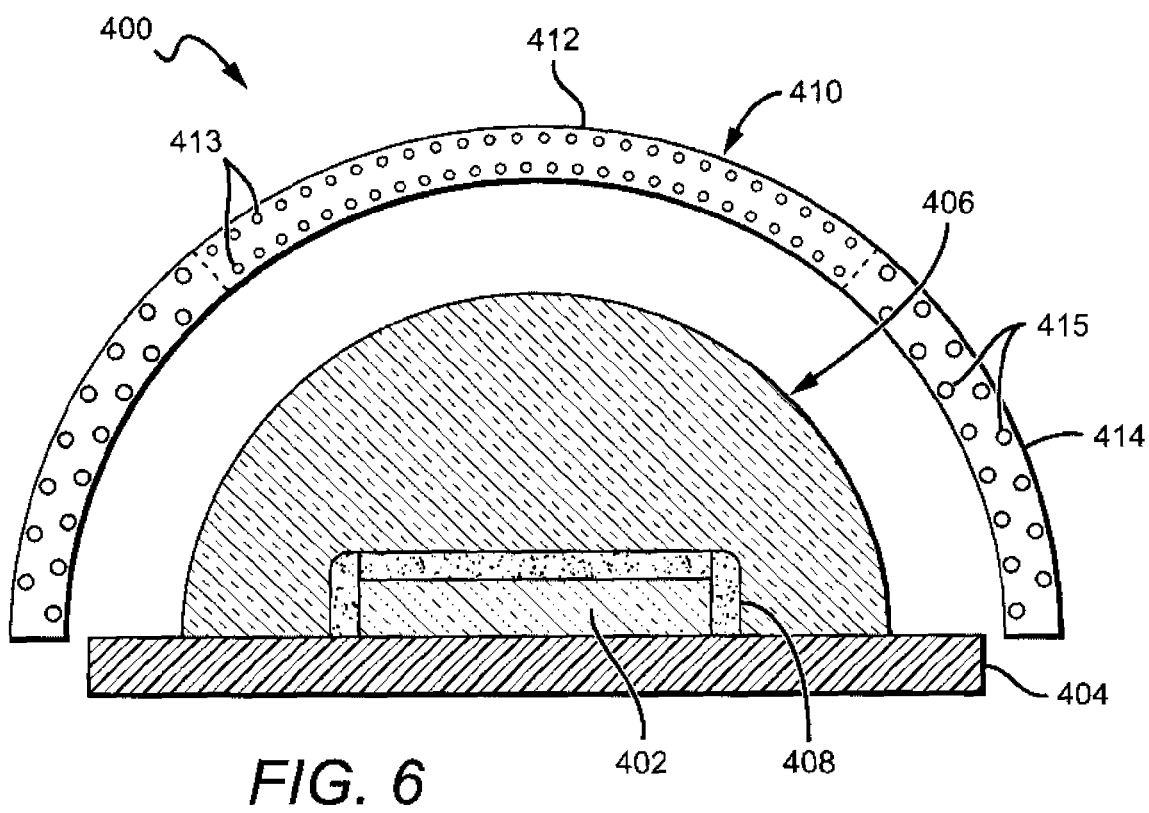
FIG. 6 is a sectional view of still another embodiment of an LED package according to the present invention.

The regions and scattering particles according to the present invention can also be proved remote to the LED package, and in particular, remote to the package lens. FIG. 6 shows another embodiment of an LED package 400 according to the present invention also comprising a LED 402, a submount 404, a lens 406, and a conversion coating 408 over the LED 402. In this embodiment, the scattering particles are provided in remote scattering particle cap 410 that is mounted remote to the lens 406. The cap 410 can be mounted in many different ways and to different portions of the LED package 400 or structure that the package 400 is mounted to.

The cap 410 comprises a first scattering particle region 412 having first scattering particles 413, and a second scattering particle region 414 having second scattering particles 415. Like the embodiments above, the first scattering particle region 412 is arranged generally over the top of the LED 402 and covers light emitting from the LED 402 at low emission angles. The second scattering particle region 414 is arranged over the sides of the LED 402 and generally covers the light emitting from the LED 402 at high emission angles. In one embodiment, the first region 412 can be arranged to cover emission angles from the LED in the range of approximately 0 to 45 degrees, and the second region 414 can be arranged to cover emission angles in the range of approximately 45-90 degrees. It is understood, however, that the regions 412, 414 can be arranged to cover different emission angles. The first and second scattering particles 413, 415 can comprise the sizes and materials described above. There can also be an abrupt or gradual transition between the first and second regions 412, 414 as described above. The cap 410 can also be formed using many different known methods, such as injection molding. The cap 410 can also be mounted to the LED package using known mounting methods and structures.

Figure 7:
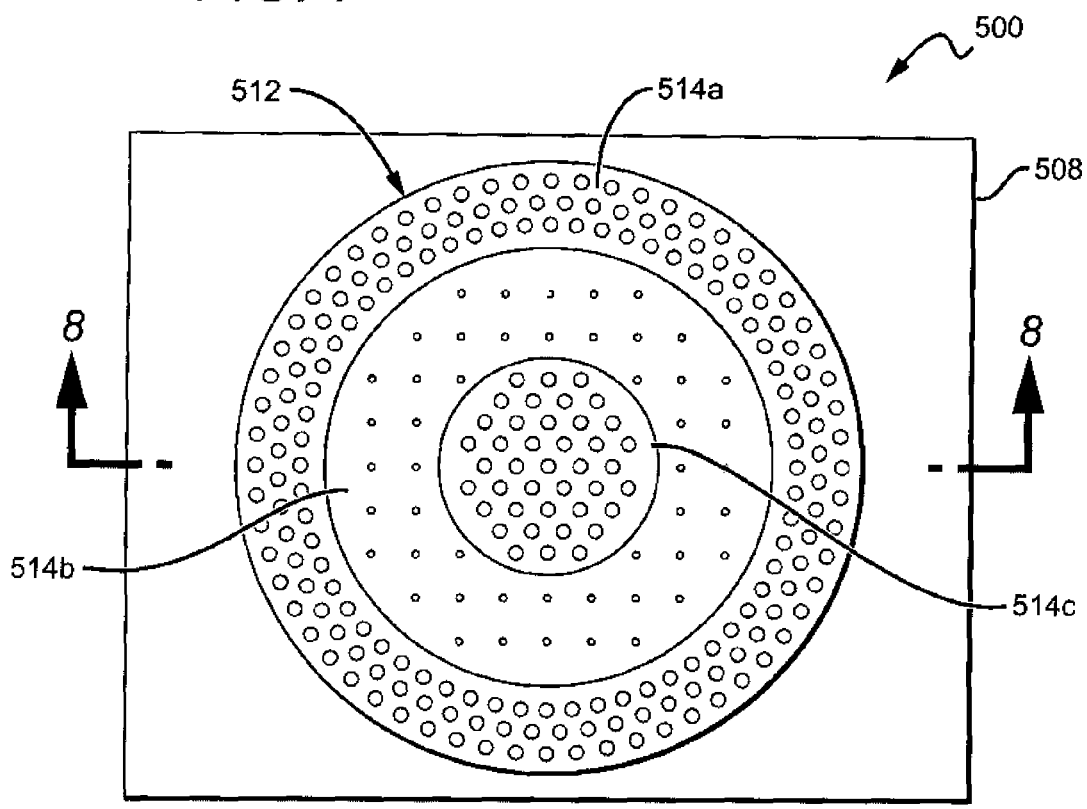
FIG. 7 is a plan view of another embodiment of an LED package according to the present invention.
Figure 8:
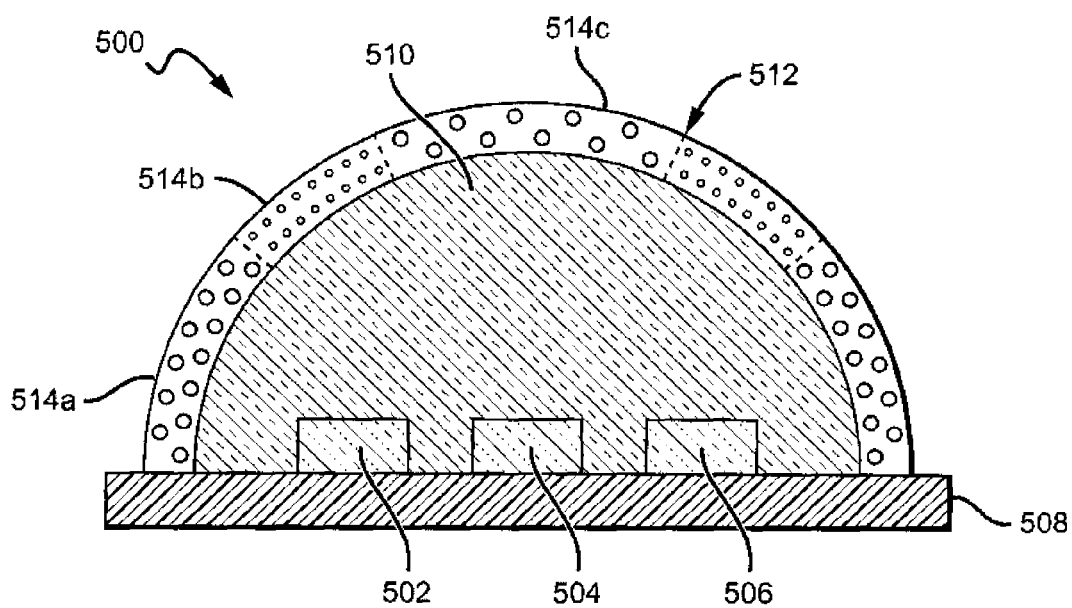
FIG. 8 is a sectional view of the LED package in FIG. 7 taken along section lines 7-7.

It is understood that the present invention is also applicable to LED packages with multiple emitters. FIGS. 7 and 8 show another embodiment of an LED package 500 according to the present invention, having a first LED 502, second LED 504 and third LED 506, all mounted to a submount 508. The LEDs 502, 504, 506 can emit different colors of light or the same or similar colors of light, and can be covered by a lens 510 that can be made of the same material and by the same methods described above. A scattering particle layer 512 can be included on the lens 510, with the layer 512 having multiple scattering particle regions 514a-c to scatter target wavelengths at different emission angles from the package. The scattering particles in each of the region can also be provided within a narrow particle size distribution to scatter the target wavelength, while minimizing the scattering of other wavelengths.

In one embodiment, the LEDs 502, 504, 506 can comprise red, green and blue emitting LED, respectively, with the different regions 514a-c having scattering particles to target scattering of red green or blue wavelengths of light. The size and location of the different regions 514a-c can depend largely on the emission characteristics of the LEDs 502, 504, 506. One possible LED arrangement can comprise a broad spectrum green or yellow emitter and a blue emitter. The wavelength ranges of these emitters can be combined to give off a white light if good color-mixing is achieved. Another arrangement might include a red emitter and a white emitter. Such a combination can be used to emit "warm" white light which has a slight reddish or orange tint. Other combinations such as a red-green-blue package (RGB) or a red-green-green-blue (RGGB) package can be used. Various other colored emitter combinations are possible. In some applications, it is desirable to select a color combination that may be used to create a device with an excellent color rendering index ("CRI"). Light sources with a good CRI are useful for lighting scenes in which the detail of the colors in the scene is significant.

In other embodiments, the LED package can comprise an array of dozens of LEDs. One such arrangement can comprise blue LED covered by a yellow conversion material (also referred to as blue shifted yellow or BSY LEDs), and red LEDs arranged so that the LED package emits a white light having a relatively warm color temperature. In this embodiment, the multiple scattering particle regions can be provided at different emission angles to scatter red, blue or yellow light as desired. This can allow for the LED package to emit a more uniform light or CCT at different viewing angles.

It is understood that that the LED packages having multiple LEDs can be provided scattering particle regions within the lens. Other such LED packages can be provided with the scattering particle regions being comprised in a cap mounted on or remote to the lens. Still other embodiment can be provided without a lens with the cap being mounted over the LEDs. In this arrangement the array of LED can comprise an array of LED packages or a combination of LEDs and LED packages.

It is understood that the scattering particles of the LED packages according to the present invention can take many different shapes beyond those described above, and need not be circular or otherwise symmetrical. It is also understood that in many embodiments the emission profile of the LED in the LED package is dependent upon the shape and thickness of the conversion coating over the LED. For different shapes and thicknesses, a different emission profile is provided, which in turn can dictate a different shape and location for the scattering particle regions.

Although the present invention has been described in detail with reference to certain preferred configurations thereof, other versions are possible. Therefore, the spirit and scope of the invention should not be limited to the versions described above.

I claim:
1. A light emitting diode (LED) package, comprising:
at least one LED that emits LED light in an LED emission profile;
a first plurality of scattering particles to scatter a first target wavelength and a second plurality of scattering particles to scatter a second target wavelength different from said first target wavelength, said first and second scattering particles arranged around said LED to scatter said LED light to improve the uniformity of said LED emission profile; and wherein said first and second scattering particles are arranged in regions around said LED based on emission angles.

2. The LED package of claim 1, wherein said LED package emits a package emission profile, said first and second scattering particles scattering said LED light such that said package emission profile has improved emission uniformity at different viewing angles compared to said LED emission profile.

3. The LED package of claim 1, wherein said first and second scattering particles are made of the same material, said first scattering particles having a first size, and said second scattering particles having a second size different from said first size.

4. The LED package of claim 1, wherein said first and second scattering particles are made of different materials.

5. The LED package of claim 1, wherein said first and second scattering particles are arranged in respective first and second scattering particle regions.

6. The LED package of claim 5, wherein said first scattering particle region covers the 0 degrees emission angle.

7. The LED package of claim 5, wherein said first scattering particle region covers at least part of the 0 to 45 degree emission angles.

8. The LED package of claim 5, wherein said second scattering particle region covers the 90 degree emission angle.

9. The LED package of claim 5, wherein said second scattering particle region covers the 75 degree emission angle.

10. The LED package of claim 5, wherein said second scattering particle region covers at least part of the 45 to 90 degree emission angles.

11. The LED package of claim 1, wherein said first scattering particles scatter blue wavelengths of light and said second scattering particles scatter yellow wavelengths of light.

12. The LED package of claim 1, wherein said first and second scattering particles have a size distribution of less than 50 percent.

13. The LED package of claim 1, wherein said first and second scattering particles have a size distribution of less than 33 percent.

14. The LED package of claim 1, wherein said first and second scattering particles are made of titanium dioxide ($TiO_2$)

15. The LED package of claim 14, wherein said first scattering particle are 0.15 microns ±0.05 microns in diameter and said second scattering particles are 0.25 microns ±0.05 microns in diameter.

16. The LED package of claim 1, comprising multiple emitters.

17. The LED package of claim 1, wherein said package emits white light.

18. An emitter package, comprising:
at least one emitter that emits light in an emitter emission profile;
a first region of first scattering particles and a second region of second scattering particles, said first and second regions of scattering particles arranged around said at least one emitter to improve the emission uniformity of said emitter package compared to said emitter emission profile; and
wherein said first and second regions of scattering particles are arranged in regions around said emitter based on emission angles.

19. The emitter package of claim 18, wherein said first and second scattering particles scatter first and second target wavelengths, wherein said first target wavelength is different from said second target wavelength.

20. The emitter package of claim 18, wherein said first scattering particles cover at least part of the 0 to 45 degree emission angles, and said second scattering particles cover at least part of the 45 to 90 degree emission angles.

21. The emitter package of claim 18, wherein said first and second scattering particles each have a size distribution of less than 50 percent.

22. The emitter package of claim 18, wherein said first and second scattering particles have a size distribution of less than 33 percent.

23. A light emitting diode (LED) package, comprising:
at least one LED that emits light in an LED emission profile; and
a first plurality of scattering particles having a first particle size distribution to scatter a first target wavelength range, and a second plurality of scattering particles having a second size distribution to scatter a second target wavelength range, each of said first and second scattering particles arranged in respective regions around said LED based on emission angles.

24. The LED package of claim 23, wherein the size and location of said regions is based on said LED emission profile.

25. The LED package of claim 23, wherein said first and second scattering particles scatter first and second target wavelengths, wherein said first target wavelength range is different from said second target wavelength range.

26. The LED package of claim 23, wherein said LED package emits light in a package emission profile, said first and second scattering particles scattering said LED light such that said package emission profile has improved emission uniformity at different viewing angles compared to said LED emission profile.

27. The LED package of claim 23, wherein said first and second scattering particles are made of the same material.

28. The LED package of claim 23, wherein said first and second scattering particles are made of different materials.

29. The LED package of claim 23, wherein said first scattering particles are in a first region covering at least part of the 0 to 45 degree emission angles.

30. The LED package of claim 23, wherein are in a second region covering at least part of the 45 to 90 degree emission angles.

31. The LED package of claim 23, wherein said first and second scattering particles each have a size distribution of less than 50 percent.

32. The LED package of claim 23, wherein said first and second scattering particles have a size distribution of less than 33 percent.

33. The LED package of claim 23, wherein said first scattering particles are 0.15 microns ±0.05 microns in diameter and said second scattering particles are 0.25 microns ±0.05 microns in diameter.

34. A light emitting diode (LED) package, comprising:
at least one LED that emits light in an LED emission profile;
first and second scattering features, wherein said first scattering feature scatters a first target wavelength of light and said second scattering feature scatters a second target wavelength, each of said first and second scattering features arranged around said LED to scatter light from said LED based on said LED emission profile such that said LED package emits a package emission profile having improved uniformity compared to said LED emission profile; and wherein said first and second scattering features are arranged in regions around said LED based on emission angles.

* * * * *